(12) United States Patent
Liu et al.

(10) Patent No.: US 8,458,842 B2
(45) Date of Patent: Jun. 11, 2013

(54) POST-CMP WAFER CLEANING APPARATUS

(75) Inventors: Li-Chung Liu, Taichung (TW); Yi-Nan Chen, Taipei (TW); Hsien-Wen Liu, Taoyuan County (TW)

(73) Assignee: Nanya Technology Corp., Kueishan, Tao-Yuan Hsinen (TW)

( * ) Notice: Subject to any disclaimer, the term of this patent is extended or adjusted under 35 U.S.C. 154(b) by 196 days.

(21) Appl. No.: 13/104,964

(22) Filed: May 10, 2011

(65) Prior Publication Data

US 2012/0284936 A1    Nov. 15, 2012

(51) Int. Cl.
*B08B 3/02* (2006.01)

(52) U.S. Cl.
USPC .................................. 15/77; 15/88.3

(58) Field of Classification Search
USPC ................ 15/77, 88.3, 88.4; 451/56
See application file for complete search history.

(56) References Cited

U.S. PATENT DOCUMENTS

| | | | |
|---|---|---|---|
| 2002/0121289 A1* | 9/2002 | Brown et al. | 134/6 |
| 2004/0162007 A1* | 8/2004 | Phan et al. | 451/36 |

\* cited by examiner

*Primary Examiner* — Shay Karls
(74) *Attorney, Agent, or Firm* — Winston Hsu; Scott Margo

(57) ABSTRACT

A post-CMP wafer cleaning apparatus includes a chamber; a plurality of rollers adapted to hold and rotate a wafer within the chamber; at least one brush adapted to scrub a surface of the wafer to be cleaned; and a liquid spraying device adapted to spray a liquid on the wafer, the liquid spraying device comprising two spray bars jointed together via a joint member.

13 Claims, 4 Drawing Sheets

POST-CMP WAFER CLEANING APPARATUS

BACKGROUND OF THE INVENTION

1. Field of the Invention

The present invention relates generally to a post-CMP wafer cleaning apparatus. More particularly, the present invention relates to a scrubber cleaner used in the cleaning of semiconductor wafer substrates after a CMP process.

2. Description of the Prior Art

As known in the art, chemical mechanical polishing (CMP) techniques are used for planarizing material layers on a wafer in semiconductor industry. Typically, in a CMP process, an abrasive suspension agent or slurry is dispensed onto a polishing surface of a polishing pad. Relative movement between the polishing surface and the wafer produces a combined mechanical and chemical effect on the surface of the wafer. This process creates a highly level surface on the wafer.

In order to remove residual slurry and other residues from the polishing process, post-CMP cleaning steps are required. One of the cleaning steps carried out after the CMP process is facilitated using rotating scrubber brushes which are actuated inside a scrubber cleaner. A combination of rotational movement of the brush and force or pressure placed on the brush against the wafer causes the residual slurry to be removed from the surface of the wafer.

However, the prior art post-CMP wafer cleaning apparatuses cannot provide satisfactory cleaning efficiency. Slurry residues and High defect count are observed along the perimeter of the wafer surface. Accordingly, there is a need in this industry to provide an improved post-CMP wafer cleaning apparatus that is capable of addressing such issue.

SUMMARY OF THE INVENTION

It is one object of the present invention to provide an improved post-CMP wafer cleaning apparatus in order to solve the above-mentioned prior art problems.

To these ends, according to one aspect of the present invention, there is provided a post-CMP wafer cleaning apparatus comprising a chamber; a plurality of rollers adapted to hold and rotate a wafer within the chamber; at least one brush adapted to scrub a surface of the wafer to be cleaned, wherein the surface of the wafer to be cleaned is divided into two segments or areas: a central area and an annular peripheral area; and a spray bar adapted to spray a liquid on the wafer, wherein the spray bar comprises a first set of the nozzles, which is looser and is provided approximately in a middle section of the spray bar correspondent to the central area, and a second set of nozzles which is denser and is provided near two ends of the spray bar corresponding to the annular peripheral area.

From one aspect of this invention, a post-CMP wafer cleaning apparatus includes a chamber; a plurality of rollers adapted to hold and rotate a wafer within the chamber; at least one brush adapted to scrub a surface of the wafer to be cleaned; and a liquid spraying device adapted to spray a liquid on the wafer, the liquid spraying device comprising two spray bars jointed together via a joint member.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1A:
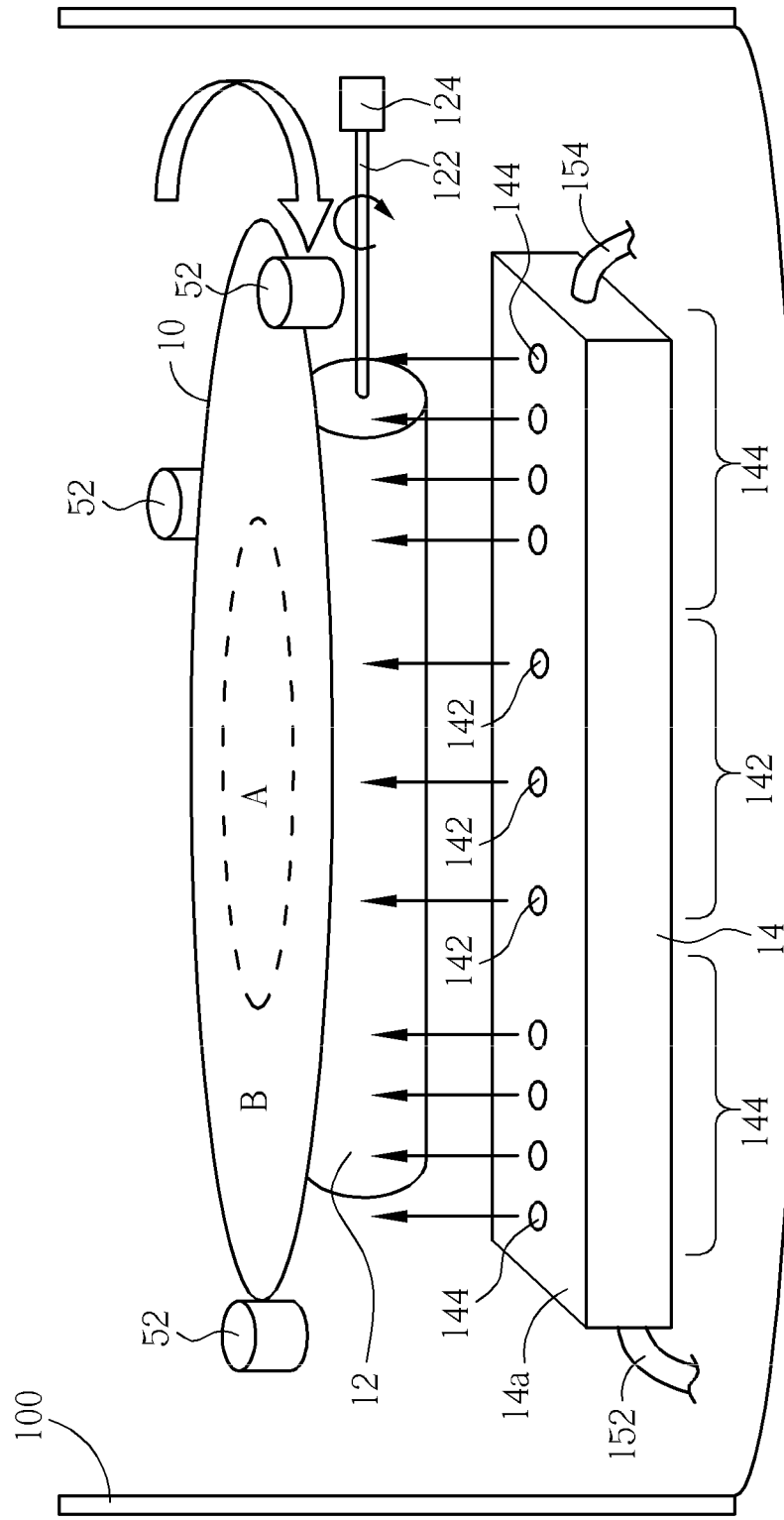
FIG. 1A is a schematic, perspective view showing germane parts of a scrubber cleaner in accordance with the first embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, where multiple embodiments are disclosed and described having some features in common, for clarity and ease of illustration and description thereof like or similar features one to another will ordinarily be described with like reference numerals.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Although the following embodiments are demonstrated using a single sided scrubber, it will be understood the present invention is also applicable to a double sided scrubber. In a single sided scrubber, one side of the wafer may be scrubbed at a time with one brush. In a double sided scrubber, the wafer may be scrubbed simultaneously on both sides by roller-shaped cleaning brushes.

Figure 1B:
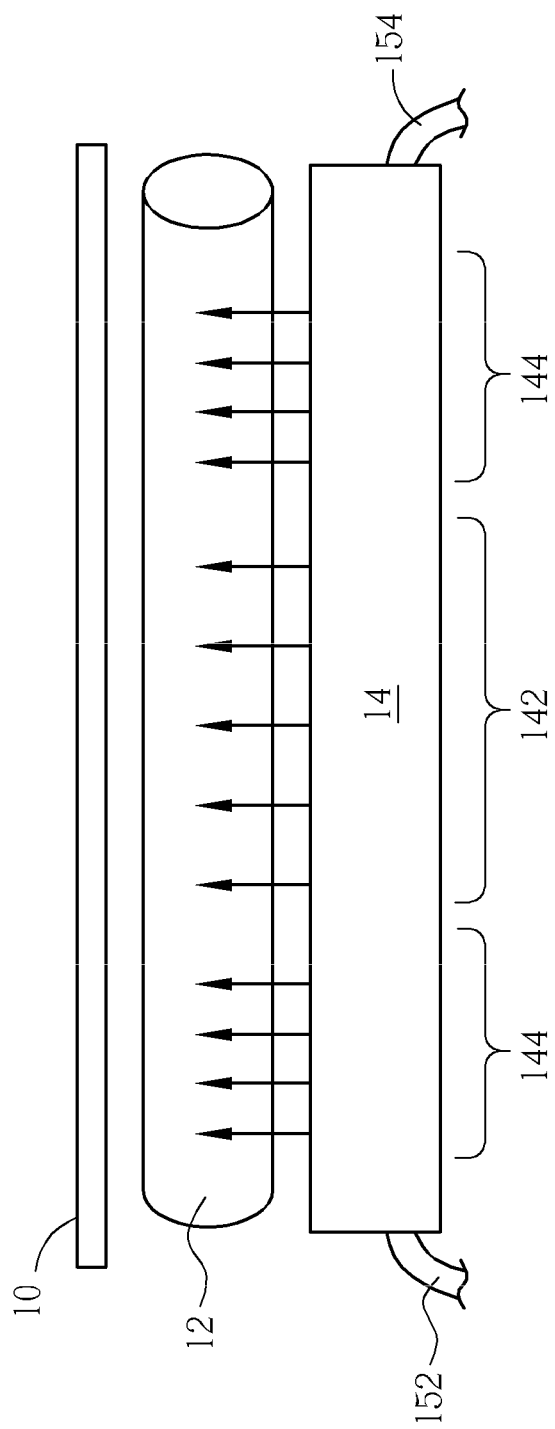
FIG. 1B is a schematic, sectional view of the scrubber cleaner in accordance with the first embodiment of the present invention.

Please refer to FIGS. 1A and 1B. FIG. 1A is a schematic, perspective view showing germane parts of a scrubber cleaner in accordance with the first embodiment of the present invention. FIG. 1B is a schematic, sectional view of the scrubber cleaner in accordance with the first embodiment of the present invention. As shown in FIGS. 1A and 1B, a wafer 10 is held and rotated by rollers 52 with its surface to be cleaned facing the roller-shaped brush 12. The brush 12 may be made of polyvinyl acetate (PVA) or sponge-like materials, preferably PVA foam. The brush 12 may be mounted on a shaft 122 which is rotated about its central axis by a motor 124. A plurality of nodules (not explicitly shown) may be provided on the brush 12. A combination of rotational movement of the brush 12 and force or pressure placed on the brush 12 against the wafer 10 causes the residual slurry to be removed from the surface of the wafer 10.

According to the first embodiment of the invention, the surface of the wafer 12 to be cleaned can be divided into two segments or areas: a central area A and an annular peripheral area B surrounding the central area A. As previously mentioned, high defect count is frequently observed in the annular peripheral area B after the wafer cleaning procedure. The present invention addresses this problem of high defect count in the peripheral area B.

Still referring to FIGS. 1A and 1B, a bar-shaped liquid spraying device 14 is disposed in proximity to the brush 12 to spray aqueous cleaning solution or agent such as tetramethyl ammonium hydroxide (TMAH) or the like onto the surface of the wafer 12 to be cleaned. According to the first embodiment of the invention, the bar-shaped liquid spraying device 14 has a slender box-like body having a top surface 14a directly facing the surface of the wafer 12 to be cleaned. The bar-shaped liquid spraying device 14 may also be referred to as "spray bar". Liquid inlet conduit 152 and liquid outlet conduit 154 may be connected to respective ends of the bar-shaped liquid spraying device 14. The rollers 52, the wafer 10, the brush 12 and the bar-shaped liquid spraying device 14 may be installed within an enclosure or chamber 100.

Two sets of nozzles or liquid spraying apertures 142 and 144 are provided on the top surface 14a of the liquid spraying device 14. According to the first embodiment of the invention, the nozzles 142 and 144 are arranged in one row along the longitudinal lengthwise direction of the bar-shaped liquid spraying device 14. The first set of the nozzles 142 is provided approximately in the middle section of the bar-shaped liquid spraying device 14 correspondent to the central area A of the wafer 10. The second set of nozzles 144 is provided near two ends of the bar-shaped liquid spraying device 14 corresponding to the annular peripheral area B of the wafer 10.

According to the first embodiment of the invention, the second set of nozzles 144 is arranged in a denser manner than the first set of nozzles 142 such that when scrubbing the wafer 10 the amount of the cleaning liquid dispensed onto the annular peripheral area B of the wafer 10 is more than that which is dispensed onto the central area A. For example, the distance between two adjacent nozzles of the second set of nozzles 144 is smaller than the distance between two adjacent nozzles of the first set of nozzles 142. As can be best seen from FIG. 1B, the spouts (indicated by arrows) coming out of the second set of nozzles 144 are denser than the spouts coming out of the first set of nozzles 142. By doing this, the slurry residues within the annular peripheral area B of the wafer 10 can be effectively removed.

Figure 2A:
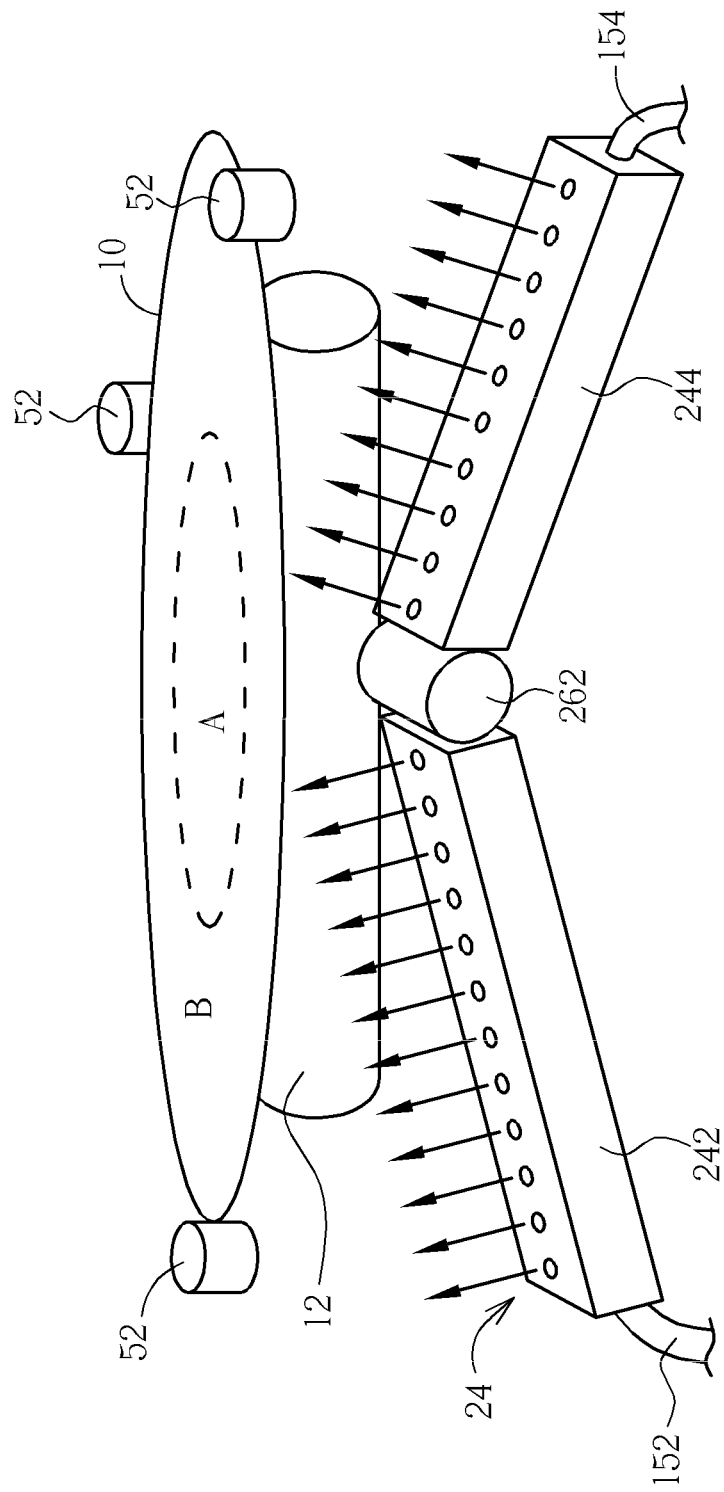
FIG. 2A is a schematic, perspective view showing germane parts of a scrubber cleaner in accordance with the second embodiment of the present invention.
Figure 2B:
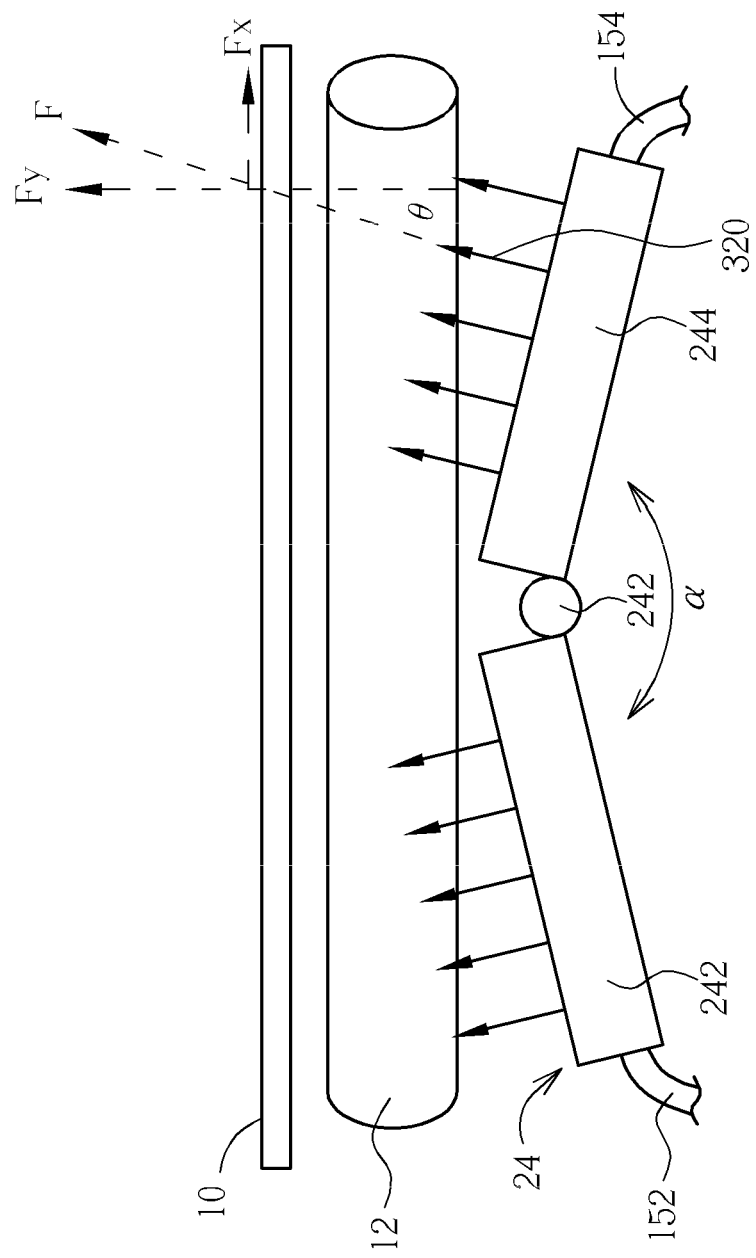
FIG. 2B is a schematic, sectional view of the scrubber cleaner in accordance with the second embodiment of the present invention.

FIG. 2A is a schematic, perspective view showing germane parts of a scrubber cleaner in accordance with the second embodiment of the present invention. FIG. 2B is a schematic, sectional view of the scrubber cleaner in accordance with the second embodiment of the present invention. As shown in FIGS. 2A and 2B, a plurality of rollers 52 are adapted to hold and rotate the wafer 10 in a horizontal orientation. The surface of the wafer 10 to be cleaned faces the roller-shaped brush 12. The brush 12 may be made of PVA or sponge-like materials, preferably PVA foam. The brush 12 may be mounted on a shaft which is rotated about its central axis by a motor. A plurality of nodules (not explicitly shown) may be provided on the brush 12. A combination of rotational movement of the brush 12 and force or pressure placed on the brush 12 against the wafer 10 causes the residual slurry to be removed from the surface of the wafer 10. It is to be understood that the elements (e.g. rollers, wafer, brush and motor) depicted in the figures may be configured within a chamber which is not shown for the sake of simplicity.

Likewise, the surface of the wafer 12 to be cleaned can be divided into two segments or areas: a central area A and an annular peripheral area B surrounding the central area A. A liquid spraying device 24 is disposed in proximity to the brush 12 to spray aqueous cleaning solution or agent such as TMAH or the like onto the surface of the wafer 12 to be cleaned. According to the second embodiment of the invention, the liquid spraying device 24 is bended and has two spray bars 242 and 244 jointed together via a joint member 262, thereby providing a reversed V-shaped configuration. The angle $\alpha$ between the two spray bars 242 and 244 is adjustable.

According to the second embodiment of the invention, the spouts (indicated by arrows) coming out of the nozzles on the two spray bars 242 and 244 are not normal to the surface of the wafer 10 to be cleaned. For example, the spout 320 with force F is directed to the surface of the wafer 10 to be cleaned with an incident angle $\theta$. A horizontal component of force Fx is therefore provided within the annular peripheral area B to facilitate the removal of slurry residues.

Those skilled in the art will readily observe that numerous modifications and alterations of the device and method may be made while retaining the teachings of the invention.

What is claimed is:

1. A post-CMP wafer cleaning apparatus, comprising:
    a chamber;
    a plurality of rollers adapted to hold and rotate a wafer within the chamber;
    at least one brush adapted to scrub a surface of the wafer to be cleaned, wherein the surface of the wafer to be cleaned is divided into two segments or areas: a central area and an annular peripheral area; and
    a spray bar adapted to spray a liquid on the wafer, wherein the spray bar comprises a first set of the nozzles provided approximately in a middle section of the spray bar correspondent to the central area, and a second set of nozzles provided near two ends of the spray bar corresponding to the annular peripheral area, wherein the second set of nozzles is more densely located than the first set of nozzles.

2. The post-CMP wafer cleaning apparatus according to claim 1 wherein a distance between two adjacent nozzles of the second set of nozzles is smaller than a distance between two adjacent nozzles of the first set of nozzles.

3. The post-CMP wafer cleaning apparatus according to claim 1 wherein spouts coming out of the second set of nozzles are denser than spouts coming out of the first set of nozzles.

4. The post-CMP wafer cleaning apparatus according to claim 1 wherein the liquid sprayed on the wafer comprises tetramethyl ammonium hydroxide (TMAH).

5. The post-CMP wafer cleaning apparatus according to claim 1 wherein the first set and second set of nozzles are arranged in one row along a longitudinal lengthwise direction of the spray bar.

6. The post-CMP wafer cleaning apparatus according to claim 1 wherein the spray bar is disposed adjacent to the brush.

7. The post-CMP wafer cleaning apparatus according to claim 1 wherein the brush is made of polyvinyl acetate (PVA).

8. A post-CMP wafer cleaning apparatus, comprising:
    a chamber;
    a plurality of rollers adapted to hold and rotate a wafer within the chamber;

at least one brush adapted to scrub a surface of the wafer to be cleaned; and a liquid spraying device adapted to spray a liquid on the wafer, the liquid spraying device comprising two spray bars joined together via a joint member in a bendable manner.

9. The post-CMP wafer cleaning apparatus according to claim 8 wherein the surface of the wafer to be cleaned is divided into two segments or areas: a central area and an annular peripheral area.

10. The post-CMP wafer cleaning apparatus according to claim 9 wherein a horizontal component of force is provided within the annular peripheral area to facilitate the removal of slurry residues.

11. The post-CMP wafer cleaning apparatus according to claim 8 wherein an angle between the two spray bars is adjustable.

12. The post-CMP wafer cleaning apparatus according to claim 8 wherein spouts coming out of nozzles of the two spray bars are not normal to the surface of the wafer to be cleaned.

13. The post-CMP wafer cleaning apparatus according to claim 8 wherein the liquid spraying device is bent, thereby providing a reversed V-shaped configuration.

\* \* \* \* \*